Figure 1:
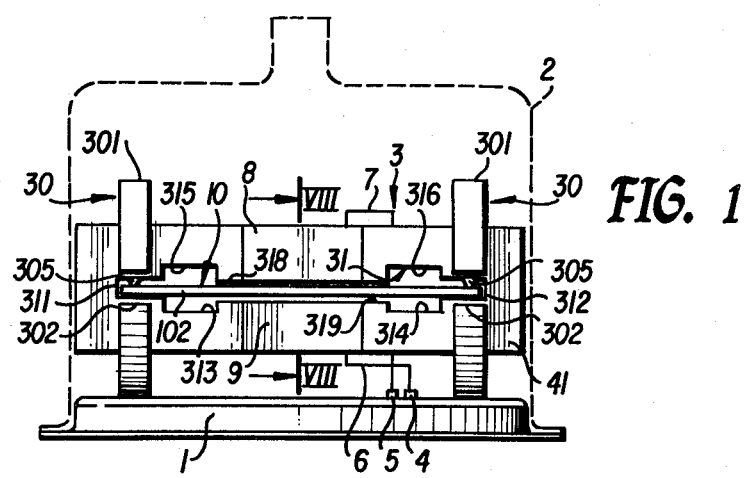

United States Patent [19]

Besson et al.

[11] Patent Number: 4,464,598

[45] Date of Patent: Aug. 7, 1984

[54] PIEZOELECTRIC RESONATOR WITH "DRAWER"

[75] Inventors: Raymond J. C. Besson, Bensancon; Pierre C. Maitre, Pirey, both of France

[73] Assignee: L'Etat Francais, Paris, France

[21] Appl. No.: 323,128

[22] Filed: Nov. 19, 1981

Related U.S. Application Data

[63] Continuation of Ser. No. 103,471, Dec. 14, 1979, abandoned.

[30] Foreign Application Priority Data

Dec. 19, 1978 [FR] France ............................ 78 35631

[51] Int. Cl.³ .............................................. H01L 41/08
[52] U.S. Cl. .................................... 310/344; 310/348; 310/349; 310/350; 310/346

[58] Field of Search ............................ 310/348–356, 310/341, 342, 344

[56] References Cited

U.S. PATENT DOCUMENTS

| 2,210,045 | 8/1940 | Schneider | 310/350 |
| 2,232,277 | 2/1941 | Schneider | 310/350 |
| 2,240,453 | 4/1941 | Wolfskill | 310/350 X |
| 2,276,013 | 3/1942 | Bohannon | 310/355 X |
| 2,358,087 | 9/1944 | Lane | 310/355 X |
| 3,495,103 | 2/1970 | Nakajima et al. | 310/355 X |
| 4,135,108 | 1/1979 | Besson | 310/349 X |

Primary Examiner—Mark O. Budd
Attorney, Agent, or Firm—Parkhurst & Oliff

[57] ABSTRACT

A quartz resonator drawer is housed in a monolithic block cabinet made of quartz. Air gap electrodes are provided on interior walls of the cabinet. The resonator drawer can be removed from the cabinet without dissemblying the electrodes or the cabinet.

21 Claims, 8 Drawing Figures

U.S. Patent  Aug. 7, 1984  Sheet 1 of 2  4,464,598

PIEZOELECTRIC RESONATOR WITH "DRAWER"

This is a continuation of application Ser. No. 103,471 filed Dec. 14, 1979, now abandoned.

The present invention relates to a so-called piezoelectric resonator with "drawer" of the type with electrodes not adhering to the crystal, comprising an airtight casing in which a vacuum has been created, or an inert gas introduced, and inside the casing, at least one piezoelectric crystal provided with a peripheral part forming a ring connected to a central part by an intermediate zone which has a short length in the radial direction, electrodes placed respectively opposite each of the faces of the central part of the crystal, at a small distance from these, and means of maintaining the electrodes and crystal in predetermined relative positions inside the casing.

The resonator of the present invention includes at least one piezoelectric crystal, also referred to as a "drawer", a rigid dielectric unit, also referred to as a "cabinet" and at least one opening in the rigid dielectric unit, also referred to as a "drawer-like" opening.

In known piezoelectric resonators in which the electrodes do not adhere to the crystal, such as those described in French Patent Application No. 2 338 607, the electrodes are deposited by metallisation onto plates or discs of dielectric material between which is interposed a piezoelectric crystal. The gap between the two electrode support plates, and thus the distance between the electrodes and the faces of the active part of the crystal placed opposite the electrodes, is determined by a peripheral portion of the piezoelectric crystal which plays the role of a junction ring and is interposed between the two plates. The creation of additional surfaces on the junction ring and on the corresponding parts of the dielectric plates which cooperate with the junction ring and enable gaps between electrode and crystal which are very small and very precise to be obtained, while ensuring that the crystal in no case comes into contact with the electrodes. Such a device is relatively convenient to regulate but implies the presence of at least three distinct components, that is, two dielectric plates and a piezoelectric crystal. These three parts are maintained assembled by securing means such as screws or springs which make these components detachable and enable for example the piezoelectric crystal to be removed to modify its geometrical characteristics, and then re-introduce it between the dielectric plates to form a resonator with different characteristics, such as a modified resonance frequency. The above mentioned system however has some disadvantages. Thus, the piezoelectric crystal cannot be removed and then re-inserted between the plates with displacing the latter. Moreover, the presence of three distinct components makes assembly relatively difficult in that securing means must be provided to maintain the three components in clearly determined relative positions with respect to one another.

The present invention aims precisely at overcoming the aforesaid disadvantages and provides a resonator simpler to manufacture and set up while safeguarding the precision features in the determination of the characteristics of the resonator.

These aims are achieved by means of a piezoelectric resonator with non-adherent electrodes of the type mentioned above in which, in accordance with the invention, the means of maintaining the electrodes and crystal in position comprise a single unit of dielectric material in which is made at least one opening which has a section greater than the section of the crystal to enable the crystal to be inserted through said opening, the electrodes are deposited on the dielectric unit in the central part respectively of the upper and lower faces of the opening so that the crystal remains fixed in said opening by its peripheral part in a manner such that the central part of the crystal remains located opposite the electrodes and with no contact with these.

The piezoelectric crystal preferably rests by portions of its peripheral part directly on the lower face of the opening of the dielectric unit in zones of said lower face which are adapted to the shape of the peripheral part of the crystal.

In that case, the mechanical means of tightning cooperate with the peripheral part of the crystal to maintain portions of this peripheral part in contact with said zones of the lower face of the opening of the dielectric unit.

The mechanical means of tightning are advantageously constituted by elastic maintaining means such as springs.

Thanks to the present invention, mounting a piezoelectric crystal between the electrodes can be achieved in a particularly convenient way. Thus, the crystal can be inserted in the opening of the piezoelectric unit like a drawer, by a simple sliding action, without this resulting in the position of the piezoelectric unit being changed. Thus, not only are the electrodes deposited on a single support, but the placing of the quartz slice between the electrodes is also facilitated. The distance between the electrodes and the faces of the active part of the quartz crystal is determined by the thickness of the peripheral part of the crystal which cooperates directly or indirectly with the peripheral parts of the upper and lower faces of the opening of the dielectric unit. The adjustment of the gaps between electrode and crystal is made easier if the peripheral part of the crystal cooperates directly with a single face, for example the lower face of the opening of the dielectric unit, whereas the maintaining means act directly on said peripheral part in order to maintain it in contact with said lower face of the opening of the dielectric unit.

According to a particular embodiment the peripheral part of the lower face of the opening of the dielectric unit projects with respect to the central part of said lower face on which an electrode is deposited.

Various means of maintaining the crystal can be envisaged. By way of example, the means of tightning may be constituted by needles each engaged and sliding in an orifice made in the upper part of the dielectric unit, each needle cooperating with a spring means to exert a pressure on the peripheral part of the crystal and maintain it in contact with the peripheral zone of the lower face of the opening of the dielectric unit.

The present invention is particularly convenient for the production of compact multiple resonators. Thus, it is possible to make in one dielectric unit a plurality of superimposed openings provided with electrodes and each fitted with a piezoelectric crystal.

Figure 2:
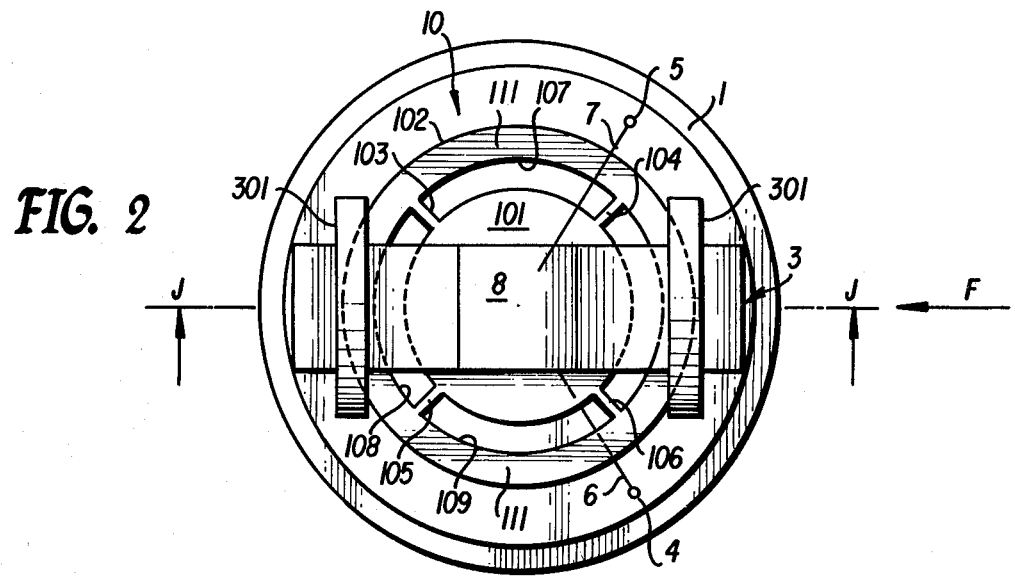
Figure 3:
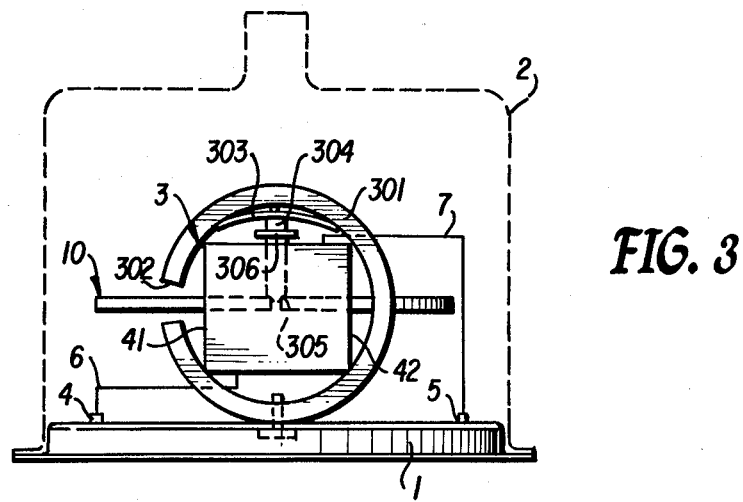
Figure 4:
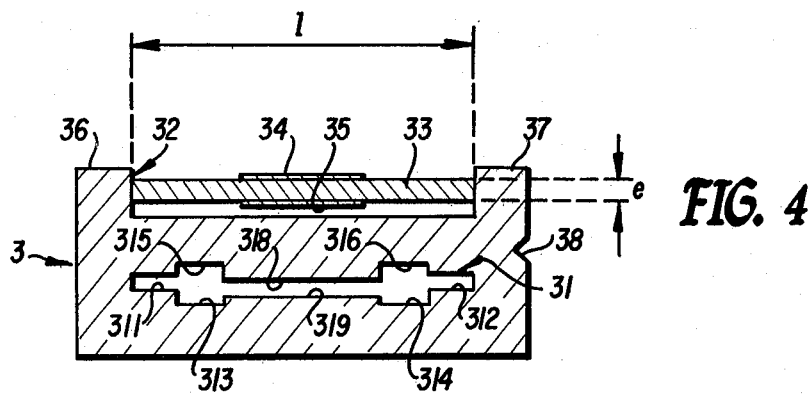
Figure 5:
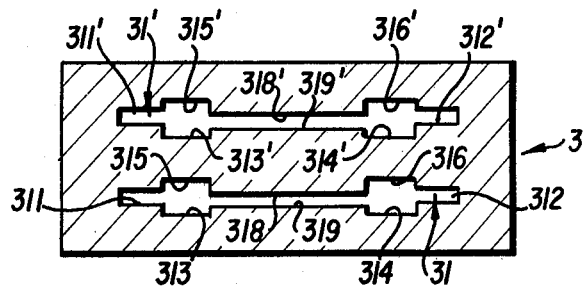
Figure 6:
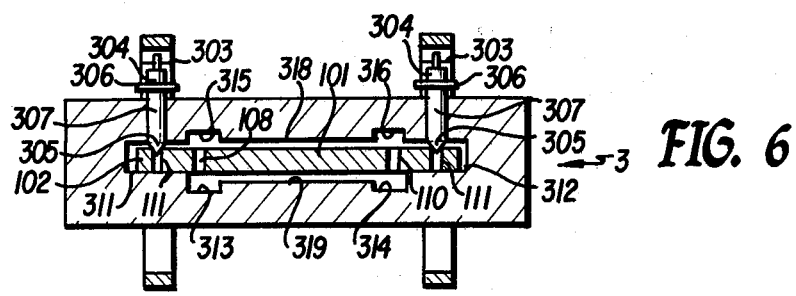
Figure 7:
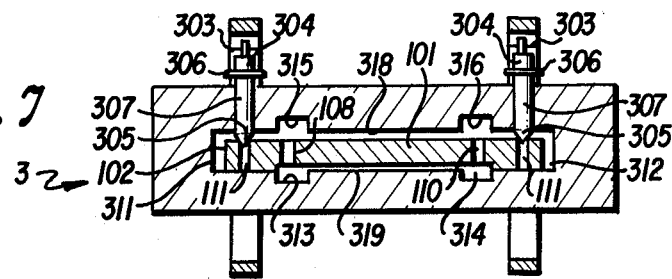
Figure 8:
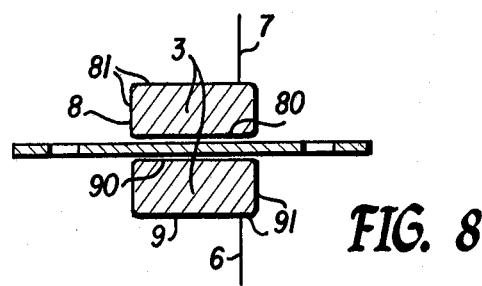

Other characteristics and advantages will stand out better in the description following the particular modes of embodiment given only by way of non-limitative examples with reference to the appended drawings, in which:

FIG. 1 is a front view of an example of a resonator according to the invention, in which the cover of the casing is shown in broken lines, FIG. 2 is a view from below the resonator in FIG. 1, in which the casing has been removed, FIG. 3 is a side view along the Arrow F in FIG. 1, FIG. 4 is a view of a part of a variant of the embodiment of the resonator in FIG. 1, in a section parallel to the plane of FIG. 1, FIG. 5 is a view of a part of a multiple resonator according to the invention, FIGS. 6 and 7 are partial views in section along the line J—J in FIG. 2 showing variants of the embodiment of a resonator according to the invention, and FIG. 8 is a section along the line VIII—VIII in FIG. 1.

If reference is made to FIGS. 1 to 3, an example is seen of a resonator in accordance with the invention comprising a base 1 onto which can be fixed hermetically a cover 2. Base 1 and cover 2 constitute a casing inside which a vacuum can be created or into which an inert gas can be introduced by conventional means.

A dielectric unit 3 supported by maintaining means 30 fixed on base 1 carries electrodes 8 and 9 connected respectively by means of connecting wires 6, 7 to insulating terminals 4, 5 to enable an electric voltage supplied by a source external to the resonator to be applied to the electrodes. A piezoelectric crystal 10 is inserted into an opening 31 made in the dielectric unit 3 supporting the electrodes 8, 9. The crystal 10 comprises an active central portion 101 placed opposite parts 80 and 90 of electrodes 8 and 9 deposited respectively on the upper and lower faces of the opening 31 made in the unit 3, and a peripheral part 102 which maintains the active central part 101 in position and cooperates with the lateral extremities 311, 312 of the opening 31 in the form of a slit. The crystal 10 can easily be engaged in slit 31 like a drawer. According to the mode of embodiment shown in FIGS. 1 and 2, the crystal 10 is biplanar and is of uniform thickness in its central part 101 and its peripheral part 102, as also at the level of the narrow connecting bridges 103 to 106 which connect the peripheral parts 102 to the central part 101 and form a part of the intermediate zone of the crystal which has a short length in the radial direction of the crystal and the major part of which is hollowed out, at the level of zones 106 to 109. By way of variant, bridges 103 to 106 could be less narrow but thinner with respect to the thickness of the central part 101 and peripheral part 102. The number, shape and location of bridges 103 to 106 in the intermediate zone of crystal 10 can naturally vary in accordance with applications.

According to the mode of embodiment shown in FIGS. 1 to 3, the piezoelectric crystal 10 is in the form of a disc while the dielectric unit 3 supporting the electrodes and the crystal is of parallelepipedal form. Thus, the crystal retains all the advantages of turning parts while the dielectric unit itself is very simple to manufacture.

Opening 31 in the form of a slit made in unit 3 passes through the latter and preferentially has plane and parallel faces. However, opening 31 is advantageously not of constant height. Various forms of opening 31 can easily be made. Thus, opening 31 can be formed by supersonic machining, which gives great precision to the geometry and dimensions of the opening 31. In FIG. 1, an opening 31 can be distinguished of which the height at all points is slightly greater than the thickness of the crystal 10, and of which the width also is slightly greater than the diameter of the crystal 10. Opening 31 has not only plane horizontal upper and lower faces but also vertical lateral faces that are parallel to one another and perpendicular to the frontal faces 41, 42 of unit 3.

The opening shown in FIG. 1 includes two extremity lateral parts 311 and 312 which cooperate with portions of the peripheral part 102 of crystal 10. The central parts 318 and 319 respectively of the upper and lower faces of opening 31 carry portions of electrode 80 and 90 designed to generate an excitation electric field for the active central part 101 of the crystal. The electrode portions 80 and 90 can for example be of square form and are deposited by metallisation onto faces 318, 319 of opening 31, unit 3 itself being preferably located in a manner such that opening 31 is substantially vertical during the metallisation operation.

The height of opening 31 is greater close to the partially hollowed-out intermediate zone of crystal 10. The recesses 313, 314 thus formed in the dielectric unit 3 facilitate for opening 31 the formation of upper and lower faces with different levels in their central part 318,319 carrying the electrode portions 80, 90 and at the lvel of the lateral extremities 311 and 312 which cooperate with portions of the peripheral part 102 of the crystal.

The shape of opening 31 and that of the crystal 10 enable gaps of predetermined thickness to be made between electrodes 8, 9 and the corresponding faces of the active central part 101 of the crystal. The dimensions of these gaps are of paramount importance since they determine the resonance frequency of the resonator. The device according to the invention enables gaps to be made between electrode and crystal of heights lower by a few microns and even some tenths of microns.

In the mode of embodiment in FIG. 1, portions of the peripheral part 102 of crystal 10 bear directly, at the level of the lateral extremely portions 311 and 312 of opening 31, on portions of the lower face of opening 31 which project with respect to the central part 319 of the lower face which supports electrode 9. The lower surface of the peripheral part 102 of the crystal and the projecting portions of the lower face of opening 31 in zones 311 and 312 are surfaces designed to correspond to one another perfectly and ensure, when they are in contact, a precise positioning of the crystal with respect to faces 318 and 319 carrying electrodes.

Holding means 30 are provided to maintain unit 3 in position inside casing 1, 2 and also lock crystal 10 in position inside the opening 31. The holding means 30 comprise, according to the example in FIGS. 1 to 3, two hoops 301 fixed on base 1. Unit 3 rests directly on the lower part of hoops 301. Hoops 301 have a gap in their forward part to form a slit 302 allowing the passage of crystal 10 which must be inserted in opening 31 of unit 3. The hoops are placed close to the extremity lateral portions 311, 312 of opening 31. In this way, additional mechanical means of tightning can cooperate both with the hoops 301 and the peripheral part 102 of the crystal to maintain crystal 10 in position with respect to unit 3. These mechanical means of tightning comprise a rod 304 ending at its lower extremity with a needle 305 and fixed to a leaf spring 303 cooperating with hoop 301. A washer 306 integral with rod 304 maintains in addition unit 3 against the lower part of hoop 301 when no crystal is engaged in slit 31. The rods-needles 304, 305 move in the orifices 307 made in the upper part of unit 3 and needle 305 is applied, by the action of spring 303, to the peripheral part 102 of crystal 10. Small holes 111 formed in the peripheral part 102, preferably in the zones away from the connecting bridges 103 to 106, can receive needles 305 and lock crystal 10 in position with respect to unit 3. Under the action of the elastic tightning means 303 to 305, the peripheral part 102 of crystal 10 is maintained applied in intimate contact with the portions of the lower face of opening 31 located near the lateral extremities of said opening, and crystal 10 can no longer move inopportunely parallel to its plane since it is maintained in a locked position by the needles 305 engaged partially in the orifices 111. The constraints exercised by the needles 305 do not affect the quality of the resonator since the intermediate zone of the crystal provides, in the manner known, an insulation of the active and vibrating central part with respect to the fixed peripheral part. Moreover, if the points of action 111 of the forces of the needles 305 are located at a substantial distance from the connecting bridges 103 to 106, the repercussion onto the central part 101 is practically nil.

In general, the present invention allows a crystal to be mounted easily between the electrodes deposited onto a distinct support of the crystal itself. Thus, crystal 10 engages like a drawer into slit 31, by its peripheral part sliding on the lateral extremities of the lower face of opening 31. The needles 305, which are first pushed upward against the action of spring 303 by the side of the crystal and then snap into the holes 111 of the crystal 10 to lock the latter in a predetermined position with respect to the opening 31, and thus with respect to electrodes 8 and 9. The positioning of the active central part 101 of the crystal does not depend on the height of the slit 31 and the thickness of crystal 10. Crystal 10 remains removable with respect to the electrode-carrying unit 3, and unit 3 itself can easily be dismantled, since the hoops 301 can easily be separated from base 1. Consequently, if a set of piezoelectric crystal of different thicknesses is available and/or a set of electrode-carrying units comprising openings 31 of different configurations, it is easily possible to make resonators with different characteristics, or adjust the characteristics of a resonator, by combining only two basic components of variable characteristics, namely, an assembly of an electrode-carrying single unit 3 and a piezoelectric crystal 10.

FIGS. 6 and 7 show two examples of the possible configuration of opening 31 of unit 3 and the piezoelectric crystal 10. According to FIG. 6, the crystal 10 is biplanar and has a constant thickness throughout its section, excepting possibly in the intermediate zone which can be thinner. The crystal 10 rests by a portion of its peripheral zone 102 directly on the lower face of opening 31, close to the lateral extremities 311, 312 of this opening. The needles 305 partially engaged in the small holes 111 made in this peripheral part 102 of the crystal maintain this latter in a fixed position with respect to unit 3. The distance between the lower face of the central part 101 of the crystal and the lower electrode portion 90 deposited on the face 319 of opening 31, is fixed and determined by the distance between the level of part 319 of the lower face of opening 31 and the level of the same lower in the lateral zones 311 and 312 supporting the crystal. The distance between the upper face of the central part 101 of the crystal and the upper part of electrode 80 deposited on face 318 of opening 31 depends on the thickness of crystal 10. The resonance frequency of the resonator can thus be modified by altering the thickness of the crystal 10.

In the mode of embodiment in FIG. 7, the lower face of opening 31 is at the same level as the lateral parts 311, 312 and in the central part 319 supporting electrode 9. The recesses 313, 314 made in zones located opposite the intermediate part of the crystal could thus, in a borderline case, be eliminated, although they can facilitate the deposition of electrode 9 on the part 319 in so far as they make a clear division between them and parts 311, 312 which in principle are without electrodes. In the case of FIG. 7, crystal 10 comprises a central part 101 which is recessed with respect to the peripheral part 102 resting on the lower face of opening 31 in zones 311, 312. The distance between the lower face of the central part 101 of the crystal and the lower part of electrode 90 located on unit 3 is thus determined by the difference of level between the lower faces of the peripheral ring 102 and the central part 101 of the crystal. An adjustment can be made by altering the thickness of the peripheral part 102 and for example by selecting a crystal from a set of crystals with peripheral parts 102 of different thicknesses.

Electrodes 8 and 9 basically are deposited on the inner faces 318, 319 of opening 31. However, to facilitate the connection of the connecting wires 6, 7 to electrodes 8, 9, a metal deposit can in addition be made on the extension of the electrodes 80, 90 as such, on the frontal faces of unit 3, as well as on the upper face of unit 3 for electrode 8, and on the lower face of unit 3 for electrode 9 (FIGS. 1,2 and 8). There is thus available in the central part of unit 3, a first metal strip 8 surrounding the unit 3 in its portion located above opening 31, and a second metal strip 9 surrounding unit 3 in its part located below opening 31; the metal strips 8, 9 could for example be made of gold.

FIGS. 4 and 5 correspond to particular characteristics of a resonator according to the invention. Unit 3 only is shown in these figures. In the mode of embodiment in FIG. 4, unit 3 comprises extensions 36, 37 between which rests an additional piezoelectric crystal 33 provided with electrodes 34, 35. The extensions 36, 37 determine a housing 32 into which the crystal 33 is inserted, and the extensions 36, 37 can be connected to the body of unit 3 by parts made slightly thinner by means of grooves such as 38. When an electric voltage V is applied to electrodes 34, 35, the piezoelectric crystal deforms. The crystal 32 can be made of piezoelectric ceramic, or for example, a quartz section the thickness of which e is along the X-axis and the length l interposed between the extensions 36, 37 of unit 3 is along the Y-axis of the crystal in which the cut is made. Under the action of the electric voltage V, the crystal 32 deforms lengthwise and acquires a length d+dl so that extensions 36,37 are pushed toward the exterior and, by bending, tend to give face 318 of opening 31 a certain concavity. The gap between the electrode 8 deposited on fce 318 of unit 3 and the corresponding face of the central part of the crystal thus tends to increase, and the frequency of the resonator to be altered. Such an alteration can be a change in the permanent frequency, if the voltage V applied to the electrodes 33, 34 is a direct current, or a modulation of the average resonance frequency of the resonator, if the voltage V is an alternating current. The gap between electrode 9 and the lower face of the central part 101 of crystal 10 could similarly be modified or modulated by the addition of extensions or arms in the lower part of unit 3, and placing a piezoelectric crystal similar to crystal 32 between said lower extensions. In general, the resonator according to the invention can moreover operate in any position, and the terms "lower", "upper", "vertical" and "horizontal" are used only with reference to the drawings to facilitate explanation. Thus, what has been stated in regard to the lower face of opening 31 can apply to the upper face of said opening and vice versa.

FIG. 5 shows a mode of embodiment of the invention in which a plurality of openings 31, 31' of the type previously described and intended to be provided with electrodes and each of these receive a piezoelectric crystal 10, are superimposed in a sane dielectric unit 3. This constitutes a very compact device which can constitute a multiple resonator. Each elementary resonator constituted by an opening such as 31 or 31' fitted with electrodes, not shown, and by a piezoelectric crystal such as 10 inserted in said opening can operate independently of one another or other elementary resonators. The characteristics of each elementary resonator are determined by the shape and dimensions of opening 31, 31', the characteristics of the electrodes and the voltage applied to these, and the shape and dimensions of the piezoelectric crystal 10. The assembly operation is extremely simple, since each crystal 10 can be engaged in a housing 31, 31' like a drawer in the manner explained before. FIG. 5 shows a unit 3 of a double resonator provided with two superimposed similar openings 31, 31'. The different parts of opening 31' are designated by primed reference figures in analogy with the parts of the opening 31. In the case of FIG. 5, the electrode deposited on face 319' of opening 31' can be connected permanently to the electrode deposited on face 318 of opening 31 and the double resonator can operate with an interdependence of the two sub-assemblies constituted by each of the openings 31, 31' provided with electrodes and fitted with a corresponding crystal according to whether a series or parallel type of assembly is chosen, similarly to the assemblies described in the French Patent Application No. 78 28 728 filed on Oct. 9, 1978 and entitled "bi-résonateur piézoélectrique".

The resonators according to the present invention are notably remarkable in that the configuration of the units supporting the electrodes may be substantially different from the geometry of the piezoelectric crystal. Thus, piezoelectric crystal 10 inserted in opening 31 of unit 3 can extend beyond the external frontal faces 41, 42 of unit 3, as shown in FIGS. 1 to 3. However, the condition of the surface of said lower face of the peripheral part 102 of crystal 10 or the condition of the surface of the partition of opening 31 designed to cooperate directly with this lower face of the peripheral part 102 of the crystal are particularly important and must have a minimum degree of roughness.

Of course any modifications or additions can be made by someone versed in the art to the devices which have just been described solely by way of examples, without departing from the scope of the protection of the invention.

Thus, according to a particular mode of embodiment, the active part of the crystal can be constituted by the peripheral part of the latter while the fixed part in that case is constituted by the central part of the crystal. This mode of embodiment naturally implies that the electrodes are then placed on the support unit in the part of the opening in the shape of a slit which is located opposite the peripheral part of the crystal and in that case, without any contact with this latter, while the crystal is maintained in position by support means which act on the central parts of the unit and the crystal, in contact by one of their faces inside the opening made in the support unit.

What is claimed:

1. A piezoelectric resonator of the type comprising an airtight casing in which a vacuum has been created or an inert gas introduced, and inside this casing, at least one piezoelectric quartz crystal drawer provided with a peripheral part forming a ring connected to a central part by an intermediate zone which has a short length in the radial direction, electrodes placed respectively opposite each of the faces of the central part of the quartz crystal drawer, at a small distance from these, and means for maintaining the electrodes and quartz crystal drawer in predetermined relative positions inside the casing, whereby the means for maintaining the electrodes and quartz crystal drawer in position are provided comprising a single unit of rigid dielectric material forming a cabinet in which at least one drawer-like opening is made which has a section greater than the section of the quartz crystal drawer to permit the quartz crystal drawer to be inserted through said drawer-like opening and positioned within said cabinet, and the electrodes are deposited on the rigid dielectric cabinet in the central part respectively of the upper and lower faces of the drawer-like opening and the quartz crystal drawer is fixed in said drawer-like opening by its peripheral part in a manner such that the central part of the quartz crystal drawer remains located opposite the electrodes and spaced apart therefrom and the quartz crystal drawer is removable from said rigid dielectric cabinet without disassemblying said electrodes and said rigid dielectric cabinet.

2. A resonator according to claim 1, wherein the piezoelectric quartz crystal drawer rests by portions of its peripheral part directly on the lower face of the drawer-like opening of the dielectric cabinet in zones of said lower face which are in the shape of the peripheral part of the quartz crystal drawer.

3. A resonator according to claim 2, including mechanical means for maintaining the peripheral part of the quartz crystal drawer to maintain portions of this peripheral part in contact with said zones of the lower face of the drawer-like opening of the dielectric cabinet.

4. A resonator according to claim 3, wherein the mechanical means for maintaining comprise an elastic holding means.

5. A resonator according to claim 1, wherein the peripheral part of the lower face of the drawer-like opening of the dielectric cabinet projects with respect to the central part of said lower face on which an electrode is deposited.

6. A resonator according to claim 1, wherein the drawer-like opening of the dielectric cabinet has a larger section in a portion located close to the intermediate zone of the quartz crystal drawer.

7. A resonator according to claim 1, wherein the quartz crystal drawer is mounted removably in the dielectric cabinet.

8. A resonator according to claim 3, wherein the mechanical means for maintaining comprise needles, each of said needles engaging and sliding in an orifice made in the upper part of the dielectric cabinet, each needle cooperating with a spring means to exert a pressure on the peripheral part of the quartz crystal drawer and maintain the latter in contact with the peripheral zone of the lower face of the opening of the dielectric cabinet.

9. A resonator according to claim 8, wherein the needles engage at least partially in the holes made in the peripheral part of the quartz crystal drawer in order to lock the quartz crystal drawer in a predetermined position.

10. A resonator according to claim 8, wherein the dielectric cabinet is maintained inside the casing by hoops fixed to said casing and the spring means are comprised of leaf springs cooperating with the hoops.

11. A resonator according to claim 1, wherein the dielectric cabinet is of a parallelpipedal form.

12. A resonator according to claim 1, wherein the drawer-like opening made in the dielectric cabinet has the shape of a slit of variable height of which the lower and upper faces are plane and parallel at least in the part supporting the electrodes.

13. A resonator according to claim 12, wherein the electrodes are square-like in shape.

14. A resonator according to claim 12, wherein the drawer-like opening made in the dielectric cabinet has the shape of a slit of which the small lateral faces are parallel to one another.

15. A resonator according to claim 14, wherein the piezoelectric quartz crystal drawer inserted in the drawer-like opening of the dielectric cabinet extends beyond the front external faces of said cabinet.

16. A resonator according to claim 15, wherein the piezoelectric quartz crystal drawer has the shape of a disc of a diameter slightly smaller than the width of the drawer-like opening in the shape of a slit made in the dielectric cabinet.

17. A resonator according to claim 9, in which the quartz crystal drawer comprises hollow portions in its intermediate part and has thin connecting bridges between its peripheral and central parts, characterised in that the holes made in the peripheral part of the quartz crystal drawer are located in zones away from the connecting bridges.

18. A resonator according to claim 17, wherein the dielectric cabinet includes at least two extensions between which rests an additional piezoelectric crystal provided with electrodes, said additional crystal modifying the required distance between the central parts of the lower and upper faces of the drawer-like opening of said dielectric cabinet carrying the electrodes in accordance with the electric voltage applied to the electrodes of the additional piezoelectric crystal.

19. A resonator according to claim 1, wherein the dielectric cabinet comprises a plurality of superimposed drawer-like openings provided with electrodes and each fitted with a piezoelectric quartz crystal drawer to form a plurality of resonators in a single cabinet.

20. A resonator according to claim 19, wherein the dielectric cabinet comprises two superimposed similar drawer-like openings each fitted with a piezoelectric quartz crystal drawer and the two quartz crystal drawers cooperate with at least one common electrode.

21. A piezoelectric resonator of the type comprising an airtight casing in which a vacuum has been created or an inert gas introduced, and inside the casing, at least one piezoelectric quartz crystal drawer provided with a peripheral part forming a ring connected to a central part by an intermediate zone which has a short length in the radial direction, electrodes placed respectively opposite each of the faces of the central and peripheral parts of the quartz crystal drawer at a small distance therefrom, and means for maintaining the electrodes and quartz crystal drawer in predetermined relative positions inside the casing, whereby the means for maintaining the electrodes and quartz crystal drawer in position comprise a single unit of rigid dielectric material forming a cabinet in which at least one drawer-like opening is made which has a section greater than the section of the quartz crystal drawer to permit the quartz crystal drawer to be inserted through said drawer-like opening and positioned within said cabinet, and wherein electrodes are deposited on the peripheral part respectively of the upper and lower faces of the drawer-like opening and the quartz crystal drawer is fixed in said drawer-like opening by its central part in a manner such that the peripheral part of the quartz crystal drawer remains located opposite the electrodes without contacting said electrodes.

* * * * *